MIXER INJECTION

Filed June 11, 1953

INVENTOR.
HENRY E. PREW

BY

Ostrolenk & Faber
ATTORNEYS

Jan. 25, 1955 H. E. PREW 2,700,730

MIXER INJECTION

Filed June 11, 1953 2 Sheets-Sheet 2

INVENTOR.
HENRY E. PREW

BY Ostrolenk & Faber

ATTORNEYS

United States Patent Office 2,700,730

Patented Jan. 25, 1955

2,700,730

MIXER INJECTION

Henry E. Prew, Jackson Heights, N. Y., assignor to Standard Coil Products Co., Inc., Los Angeles, Calif., a corporation of Illinois Application June 11, 1953, Serial No. 360,877

5 Claims. (Cl. 250—20)

The present invention relates to television tuners and more specifically it relates to television tuners operable at ultra-high frequencies.

It is well known in the art that essentially two methods of tuning have evolved during the development of U. H. F. television tuners; namely, continuous tuning and discrete channel step tuning.

Of the two methods, the second has considerable advantages due to the ease with which channel selection can be made since, by discrete tuning, one can select a channel without having to accurately align the tuner to the correct channel frequency.

One of the most important problems encountered in the development of such discrete television tuners is that of accurately tuning at all ultra-high frequencies where, as is well known, the use of lumped constants becomes problematic. It was found, in fact, that at the highest ultra-high frequencies, around 1,000 megacycles, the tuning inductance for an oscillator may consist solely of a short circuit.

Another problem was that of obtaining equal band spread for the U. H. F. oscillator regardless of the frequency at which the oscillator operates. This problem arises from the fact that each television channel is given a band of 6 megacycles whether at V. H. F. or the highest U. H. F. On the other hand, it is known that if a single variable tuning element is used for operation at low frequencies and at high frequencies, while the mechanical movement of such a tuning element by a certain angle may encompass a relatively small number of channels when operating at high frequenciees rotation through the same angle would encompass a much larger number of channels.

In a discrete tuner it is necessary to have such a constant band spread so that at each position of the tuner only the desired 6 megacycles corresponding to the channel selected are passed to the utilization circuits of the television set. To increase the ease of selecting television channels, a so-called decimal type of discrete tuning can be used. In such a system, the whole television range is divided into a number of bands, each of these bands comprising ten channels. The operation of such a decimal type discrete tuner may then consist of two steps; the selection of the band and the selection of a channel within that band.

Since in the decimal system each band consists of ten channels, each band will encompass 60 megacycles. In addition, in order to select with ease an individual channel among those in a certain band it is necessary to provide a tuning element so that the rate of change of the frequency with respect to the angular rotation of the element will be always equal to a constant. This means that equal angular rotation of the tuning element should give equal changes of frequency.

The problem encountered with the tuning of the oscillator at the highest U. H. F. frequencies appears also in the preselector, which is the stage immediately following the antenna connections. The preselector too must be capable of operation up to approximately 900 megacycles and at the highest frequencies the electrical elements determining the tuned frequency must have finite magnitudes and not be short circuits so that a definite control of the frequency of operation of the preselector may be obtained.

These problems are overcome by the tuner disclosed in co-pending application Serial No. 357,495 filed May 26, 1953 which consists essentially of a preselector, mixer and oscillator, all tunable through discrete steps. The tuning elements for both the oscillator and the preselector are lumped inductances from the lowest to the highest frequencies of operation. These tuning elements serve to switch in the desired bands in the U. H. F. range.

In addition, a channel selecting element, in this embodiment a variable capacitor, is designed to have a straight line frequency response and serves to select an individual channel among the channels of each band. A single capacitor is used for channel selection in all the U. H. F. bands. More specifically, each of the previously mentioned inductances switches in bands of 60 megacycles while the variable capacitor that accomplishes the tuning within each 60 megacycles band is the same capacitor regardless of the band and varies the frequency linearly over each range and has a spread of exactly 60 megacycles between minimum and maximum rotation of each band.

The oscillator of the present tuner consists of a high frequency triode with tuning elements switched in between its plate and its grid. The tuning elements are inductances in series with the plate and the grid and connected to each other through a fixed and a variable band spread capacitance in parallel. The variable capacitance permits accurate trimming of the oscillator.

Stationarily connected to the oscillator tube terminals is a set of male contacts of a wafer switch, in this embodiment, circularly shaped. The female elements of the wafer switch are mounted on the circumference of circular dielectric plates. The male contacts are mounted as close as possible to the pins of the oscillator tube and since the tuning elements, in this case inductances, are connected across each pair of female contacts a very short electrical path exists between the tube pins and the tuning elements. By this means, even at the highest frequencies, it is possible to use easily controllable lumped inductances.

Also mounted very close to the base of the oscillator tube is a channel selecting capacitor consisting of conductive plates having at their ends another set of male contacts for the previously mentioned wafer switch. A dielectric or conductive plate whose construction will be described hereinafter is movable between the plates to vary the capacitance at such a rate that equal angular rotation corresponds to equal frequency changes regardless of the position of the tuner in the frequency range. This plate is completely insulated from the chassis by the provision of an insulating shaft so that, electrically, it will be floating.

The two dielectric discs are mounted on a common shaft provided with positioning means corresponding to the accurate contact making position between the previously mentioned dielectric plate mounted female contacts and stationarily mounted male contacts.

Means are also provided for varying slightly the inductance of the tuning elements and the capacitance of the band spread capacitors. In the case of inductances, a non-conducting coil form may be introduced in the coil and a screw inserted therein so that the position of the screw will determine the inductance of the coil. Similarly, a screw within a dielectric cylinder may be positioned between two plates of any form such that variation of the position of the screw will determine the capacitance between the plates.

It is necessary to point out that these trimming elements are mounted on the dielectric plates and are easily accessible from the outside.

In addition, it was found that in order to have more control over inductance at the high frequencies series capacitors may be connected to the tuning inductances. The addition of these series capacitances results not only in more controlled inductance but also in less shunting capacitance necessary to produce the desired 60 megacycle band spreads at the high bands.

Similar series capacitors are also connected to the tuning inductances of the preselector at the highest frequency bands and they provide also a means for controlling the band spread.

The problems encountered in the preselector and overcome by the above mentioned co-pending application are essentially as pointed out above those described in connection with the oscillator, but in the mixer section if a low capacity link is used as the injecting device for injecting the oscillator signals into the mixer, as the oscillator frequency is varied over any given pass band, the injection current through the mixer varies, thereby changing the pass band response between different oscillator settings on the same band. The reason for this phenomenon is that for a fixed pass band preselector with the oscillator operating at approximately 40 megacycles higher than the incoming signals the oscillator frequency moves from a point on the pass band to the skirt outside the pass band as the oscillator is tuned from minimum to maximum frequency over a given band. Hence, the impedance given to the oscillator injection varies over the band; the mixer current varies, and the impedance presented by the mixer changes causing a variation in the pass band.

To overcome this difficulty a compensating device is disclosed in the above co-pending application. This compensating device consists essentially of a conductive strip provided at one end with a spring section actuated by the shaft of the variable capacitor. The spring strap serves as a coupling means to the output of the oscillator and if the end of the variable capacitor shaft is properly shaped, rotation of this shaft will cause movement of the strap with respect to the oscillator terminals, thus providing a compensation for the effects described above through equal and opposite impedance changes.

By the use of such a method of injection the injection current was found to vary by a very small ratio with consequent good band pass stability with respect to changes in oscillator frequency over any given band. It was also found that the ratio of maximum injection current on any one band to minimum current on any other band was within acceptable values.

An object of the present invention is, therefore, a device for compensating for changes in impedance presented by the mixer which might cause variations in the pass band.

Actually the injection method described above provides variable coupling only at the oscillator end and not at the mixer end, which is quite satisfactory in the case of a preselector capable of selecting 60 megacycle bands in the U. H. F. region but not individual channels in the 60 megacycle bands.

When the preselector is provided with a straight line frequency variable capacitor to permit selection of individual channels in each band, the injection system of the present invention consists of two conductive plates secured to or an integral part of the oscillator variable capacitor and the preselector variable capacitor to which the plate of the oscillator tube and the mixer crystal are, respectively, connected. In addition to these conductive plates, the common shaft carrying the movable plates of the two capacitors is provided with a silver or other conductive plating tapered at the two ends, where capacitive action exists between the silver plating on the shaft and the two stationary conductive plates. The tapering is arranged so that since the shaft rotates only through a predetermined number of degrees less than 360°, capacitive coupling between the stationary plates and the silver plating decreases as the capacitance of the capacitor decreases or as the corresponding frequency increases.

By such an injection method it is possible to obtain optimum mixing at all frequencies of the desired frequency region.

Accordingly, a further object of the present invention is the provision of means for varying the injection from oscillator to mixer at both ends, namely at the output of the oscillator and at the input of the mixer.

To an input of the television tuner is connected a novel broad band U. H. F. impedance transformer which, in this particular embodiment, serves to transform the 300 ohm impedance presented by the twin lead transmission line from the antenna to the 50 ohm input impedance of the tuner. This novel transformer consists of a short section of twin leads from the 300 ohm transmission line connected to two more sections in parallel of the same twin lead type. These two sections are followed by three more sections of the same type also in parallel.

Such an input transformer has an average standing wave ratio which is close to one from 400 megacycles to 900 megacycles, that is, throughout the U. H. F. range.

These and other objects of the present invention will become apparent from the description taken in connection with the drawings in which.

Figures 1, 1A:
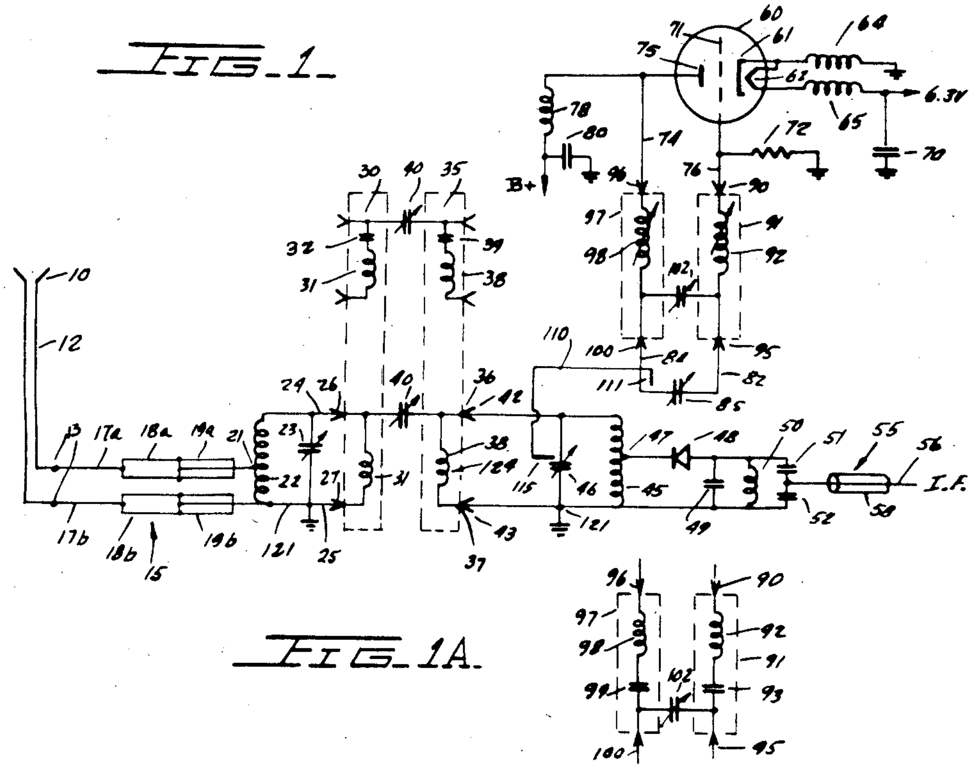
Figure 1 is the circuit diagram of one embodiment of the present invention.
Figure 1A is a detail drawing of the tuner of the present invention showing its high frequency tuning elements.

Referring first to Figure 1 showing the electrical circuit diagram of this novel U. H. F. tuner, the U. H. F. antenna 10 is connected by means of a transmission line 12, for example, of the twin lead type, to the input terminals 13 of the input transformer 15. Input transformer 15 serves to change the impedance from the 300 ohm level at the input side to 50 ohms at the output side in the present embodiment.

Input transformer 15 consists of three sections. The first section 17 is formed by one 2½ inch section 1*f* 150 ohm twin lead line. Each of the twin leads 17*a* and 17*b* is in its turn connected to a section 18 of 150 ohm twin lead line. These sections 18 are 1⅛ inches long and are each connected at their other end to three one inch sections 19 of the same type lead.

The leads forming each set 19 are connected together at the input and output; and while set 19*a* is connected to ground, set 19*b* is connected to a tap on the inductive coil 22.

In the embodiment shown in Figure 1 coil 22 is shunted by a variable capacitance 23 of approximately .5 to 3.0 micromicrofarads which serves to give an equal band spread of approximately 60 megacycles at any U. H. F. range from approximately 400 megacycles to approximately 900 megacycles.

To this parallel combination are connected male contacts 24 and 25 which, as described hereinafter, are stationary and are engaged by the female contacts 26 and 27 mounted on an insulating disc 30. As will be later described, disc 30 is rotatable and during its rotation will connect across contacts 24 and 25 coils of different inductances or series L-C circuits to permit the selection of any desired 60 megacycle band in the U. H. F. region.

For example, at the lower ultra high frequencies, mounted on disc 30 and connected across female contacts 26 and 27 is the tuning inductance 31.

In alignment with and rotatable with disc 30 is a second insulating disc 35. Disc 35 similarly carries a plurality of female contacts such as 36 and 37, across which is connected for the lower ultra-high frequencies, a tuning inductance 38.

A small variable capacitance 40 connects coil 31 to coil 38. To tune the higher ultra-high frequencies, a circuit consisting of a capacitor 32 in series with an inductance 31 on disc 30 and a capacitor 39 in series with an inductance 38 on disc 35, is connected across contacts 24—28 and 42—43 with capacitor 40 coupling circuit 31—32 with circuit 38—39.

The function of capacitors 32 and 39 is to permit the use of physically longer inductances 31 and 38 for tuning at the higher ultra-high frequencies, for otherwise at these high frequencies, coil 31 and 38 would have to be practically short circuits.

In addition, capacitors 32 and 39 serve to control the band spread at different frequencies so as to obtain always a band spread of, for example, 60 megacycles. The magnitude of these capacitors is about 5 or 6 micromicrofarads.

Female contacts 36 and 37 are shown in Figure 1 in engagement with male contacts 42 and 43, respectively, to which a parallel circuit consisting of inductance 45 and capacitance 46 is connected.

Capacitance 46 is a variable capacitance of the same order of magnitude as capacitance 23; that is, from .5 to 3.0 micromicrofarads.

Connected between ground and a few turns of coil 45 is a circuit consisting of a crystal mixer 48 in series with capacitance 49. Across capacitance 49 is connected a coil 50 which, with capacitance 49, is tuned to the intermediate frequency of the television receiver, at the present time approximately 40 megacycles.

Also connected across coil 50 is a voltage divider consisting of two capacitors 51 and 52, each of 10 micromicrofarads. The I. F. output is obtained by means of a co-axial cable 55 between the two capacitors 51 and 52 while the outer conductor 58 of cable 55 is connected to ground. Between conductors 56 and 58 will then appear the desired signals at the correct intermediate frequency.

As previously mentioned, except for the electrical components mounted on discs 30 and 35 all the other components are stationary and mounted directly on the chassis of the television tuner. Also mounted on the television tuner is the U. H. F. oscillator consisting of a high frequency triode such as the 6AF4, here denoted by numeral 60, having its cathode 61 tied to one side of filament 62 and connected to ground through a radio frequency choke 64. The other side of filament 62 is connected through a second radio frequency choke 65 to the 6.3 volt filament supply.

In addition, the radio frequency choke 65 is connected to ground through a 1,000 micromicrofarad capacitor 70. The grid 71 of tube 60 is connected to a grid lead resistor 72 having its other side connected to ground and to a stationary male contact 76. Plate 75 of tube 60 is also directly connected to a male contact 74 in alignment with contact 76.

In addition, plate 75 is connected to the B+ supply through a radio frequency choke 78 by-passed to ground by capacitor 80. Capacitor 80, in the present example, has a magnitude of 1,000 micromicrofarads.

Also mounted stationarily is another pair of male contacts 82 and 84 across which is connected a variable capacitor 85, which as described hereinafter serves for selecting a desired channel within any U. H. F. band.

During operation of the tuner, across male contacts 76 and 82, and 74 and 84, respectively, is connected a circuit consisting of the tuning inductances and capacitances. More specifically, male contact 76 connected to grid 71 of tube 60 is in engagement with the female contact 90 mounted on an insulating disc 91 and connected to a tuning coil 92 also mounted on insulating disc 91. The other end of coil 92 is connected to another female contact 95 also on insulating plate 91 which engages male contact 82 of variable capacitance 85.

Similarly, male contact 74 which is connected to the plate 75 of U. H. F. triode 60, is connected to the female contact 96 on insulating disc 97 in alignment and rotatable with insulating disc 91. Female contact 96 is connected to a tuning inductance 98 of the same magnitude as inductance 92. The other end of inductive coil 98 is connected to another female contact 100 which is shown in Figure 1 in engagement with stationary male contact 84 of variable capacitor 85.

A variable padding capacitance 102 is connected between inductance 92 and inductance 98 from one insulating disc 91 to the other insulating disc 92 to provide the necessary equal band spread of 60 megacycles for operation at the desired U. H. F. frequencies.

Capacitor 85, on the other hand, serves through its variation to obtain selection of a channel in the U. H. F. band tuned in by means of inductances 92 and 98.

At the highest U. H. F. bands it is found that the magnitudes of inductances 92 and 98 must be very small, thus making frequency control by means of inductances 92 and 98 difficult at those frequencies. To improve control over frequency at the highest U. H. F. bands, capacitors 93 and 99 (see Figure 1A) are connected in series to inductances 92 and 98, respectively, where inductances 92 and 98 are the ones to be connected to plate 75 and grid 71 of tube 60 to cause tube 60 to oscillate at these highest U. H. F. bands. By the addition of capacitors 93 and 99, the number of turns of coils 92 and 98 can be increased considerably, thus providing the necessary amount of control over the frequency of oscillation of tube 60.

Injection device 110 consists in one example of a conductive strip having at one end a conductive section 111 which capacitively couples the output from oscillator 60 obtained from one plate of variable capacitance 85 to the conductive strap 110. The conductive strap 110 serves to conduct the oscillator signals to mixer 48 to which it is also capacitively coupled at 115.

It is important to point out that the novel oscillator will switch in 60 megacycles bands in large steps when the correct inductances 92 and 98 are connected between the grid 71 and the plate 75 of tube 60. In addition, through operation of capacitance 85, the oscillator 60 will tune in 6 megacycle bands corresponding to individual channels. Each set of circuits 92—98—102 (Figure 1) or 92—93—98—99—102 (Figure 1A), therefore, tunes in 60 megacycles at different frequencies from approximately 400 to approximately 900 megacycles while the single capacitor 85 is capable of selecting any channel within each band by continuous rotation of the same.

In other words, capacitor 85 varies the frequency linearly through 60 megacycles over each range; or, to be more precise, capacitor 85 varies the frequency linearly over each range and has a spread of exactly 60 megacycles.

It is also necessary to point out that male contacts 74 and 76 are connected as close as possible to the pins of tube 6AF4 so that the smallest amount of stray inductance is introduced in the circuit by the connections. This and the addition of series capacitances 93 and 99 makes the magnitude of inductances 92 and 98 at the highest U. H. F. bands such that they may be easily controlled.

Inductances 92 and 98 are actually variable to permit the tuning operation during assembly or installation of the television set.

Similarly, in order to adjust the band spread, capacitors 102 are also made adjustable.

As for the band preselector which uses tuning elements 31 and 38, inductances 22 and 45 represent the basic input and output inductances with taps 21 and 47 respectively, for input and output connections at proper impedance levels. Capacitances 23 and 46, as previously mentioned, are variable and are adjusted to resonate with inductances 22 and 45, respectively, at a basic frequency lower than the lowest frequency in the U. H. F. television band.

The switched-in inductances 31 and 38 serve to increase the resonant frequency in 60 megacycle steps when connected in parallel with inductances 22 and 45 respectively.

Capacitor 40, which is adjustable, is different for every 60 megacycle band, each capacitor 40 being adjusted for proper coupling on each band.

Figure 3:
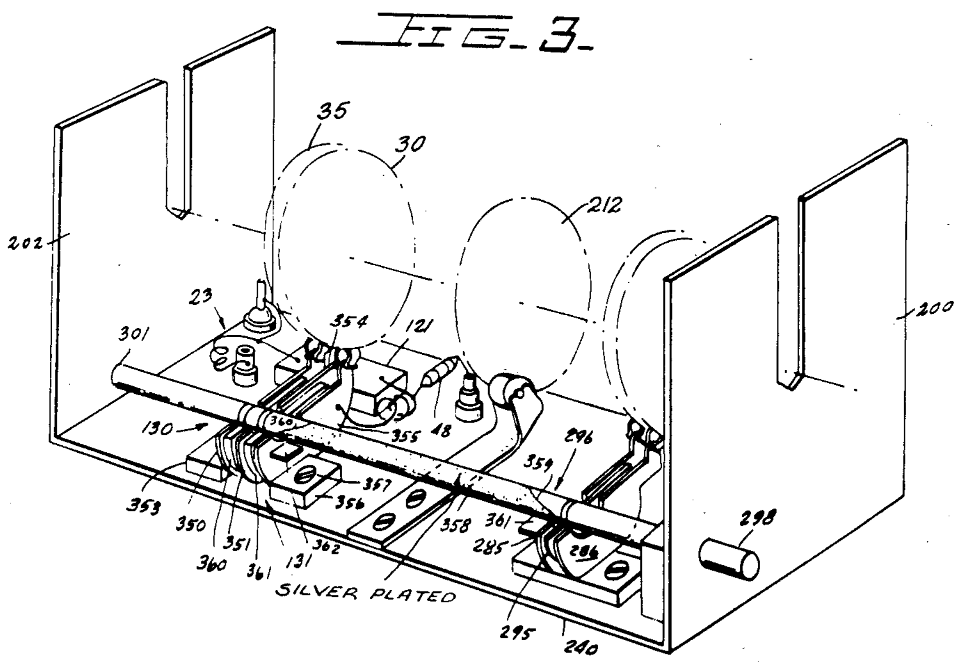
Figure 3 is an exploded view of the tuner of Figure 2 showing the variable injection means.

In the embodiment shown in Figures 1 and 3, a ground plane 120 is extended from the grounding block 121 to which male contacts 25 and 43 are fixedly connected. The detector 48 in this case a 1N82 crystal, is tapped to the output coil 45 at its appropriate point 47. It will be noted that inductances 22 and 45 are connected to capacitance 23 and 46, respectively, and all grounded on the grounding block 121.

As will be described in more detail hereinafter, coils 31 and 38 mounted on insulating discs 30 and 35 have their grounding ends 123 and 124 respectively, connected by means of short lengths of wire to a grounding block mounted on the conducting shaft. As described later, these wires form a spider and serve to make it impossible for suck-out to be produced by coils other than the ones switched in on any band. These suck-outs create otherwise spurious responses in the desired pass band. By means of this grounding spider such suck-outs are eliminated.

Figure 2:
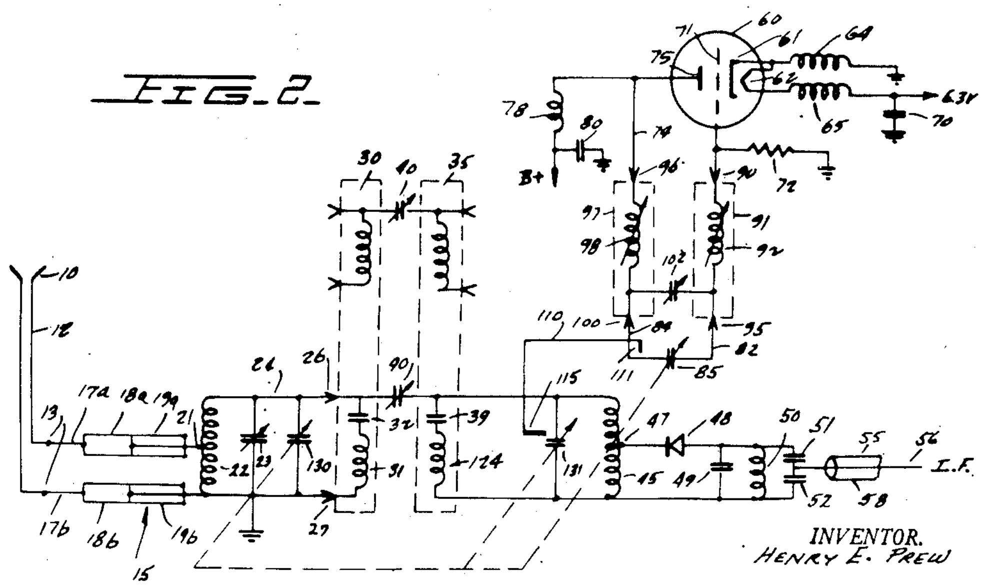
Figure 2 is the circuit diagram of another embodiment of the present invention.

In another embodiment of the present invention shown in Figure 2, the band preselector is provided with tuning capacitors 130 and 131 on the input and output side, respectively, of the preselector. Correspondingly, variable capacitance 46 is eliminated.

Capacitances 130 and 131 connected across inductances 22 and 45, respectively, track with capacitance 85 of oscillator tube 60 over each megacycle band with a band width of about 20 to 30 megacycles. By means of capacitances 130 eand 131, it is thus possible to decrease the pass band from 60 megacycles to 20–30 megacycles within which the desired television channel is located.

In the embodiment shown in Figure 2, variable capacitor 23 which was previously mentioned varies from .5 to 3.0 micromicrofarads and serves to balance, on the input side, the capacity of crystal 48 on the output side so that equal band spreads are achieved in both input and output of this preselector.

Capacitor 130 consists of stator plates 350 and 351. Stator plate 350 is mounted on an insulating block 353 secured on the base 240 of chassis 200 in any suitable way. Stator plate 351 is connected to ground, that is, to the base 240 of chassis 200 and on both ends. More specifically, at one end 354 it is firmly secured and in good electrical engagement with the grounding block of the type previously described and denoted, therefore, with the same numeral 121.

The other capacitor 131 is also provided with a pair of stator plates, one of which is the previously mentioned 251 and the other stator plate 355. Stator plate 355 is mounted on an insulating base 356 secured to base 240 of chassis 200 by any appropriate means as, for example, a screw 357. Insulating blocks 353 and 356 serve to maintain plates 350 and 355 above ground, the ground being connected to the other plate of capacitors 130, 131, that is, plate 351.

Since, as described in connection with Figure 2, capacitances 130, 131 have the function of tuning the preselector so that it may pass the desired frequencies, it is possible to do without the previously mentioned trimmer capacitors 23 and 46. Actually, of the two, only trimmer 46 is eliminated since the adjustment obtainable with trimmer 23 serves to accurately balance one part of the preselector, the part to which capacitor 130 is connected with the other part of the preselector in which capacitor 131 is connected.

Plate 351 serves also as a shielding device between the above-mentioned two portions of the preselector.

Referring in fact to the embodiment of Figure 3, shaft 296, which as previously mentioned carries movable plate 295 of capacitor 85, extends beyond capacitor 85 so as to carry also plates 360 and 361 of capacitors 130 and 131 in the preselector stage, so that a single rotation of shaft 296 produces the necessary changes in the capacitance of capacitors 85, 130 and 131.

While one end 298 of shaft 296 extends through the front plate 201 of chassis 200, the other end 301 extends through back plate 202 of chassis 200, through an appropriate opening in chassis 200, serving as a bearing.

The portion 358 of shaft 296, intermediate between capacitors 85 and 131 is silver plated so that plated springs 359 and 360 are obtained at the portions of section 358 closest to plates 285 and 355 of capacitors 85 and 131.

In this second embodiment, plates 285 and 355 are provided with conductive plates 361 and 362 respectively, shown in Figure 3, as perpendicular to plates 285 and 355.

Plates 361 and 362 may be obtained from plates 285 and 355 by appropriate stamping.

By such an arrangement of platings 359 and 360 connected by the plating portion 358 of shaft 396, and conductive plates 361 and 362, two variable coupling capacitors or movable injection points are obtained since as shaft 296 is rotated, the area of tapered platings 359 and 360 directly facing plates 361 and 362 varies.

The variation is such that minimum capacitance or coupling exists between plating 359 and plate 361, and plating 360 and plate 362 when capacitors 85 and 131 are set to minimum capacitance and maximum frequency.

Thus as the frequency is changed through rotation of shaft 296, the amount of injection into the mixer 48 is also changed in a desired way to obtain optimum and constant conversion at all used frequencies.

Since many other modifications will now be apparent to those skilled in the art, I wish to be limited, not by the disclosure herein, but only by the appended claims.

I claim:

1. A television tuner for reception of U. H. F. channels comprising a preselector, an oscillator and a mixer where the said preselector and oscillator are connected to the said mixer for obtaining a utilizable signal at an intermediate frequency, means for tuning said oscillator and preselector to different bands in the U. H. F. range, said means providing for equal band spread irrespective of the U. H. F. bands being tuned, a second tuning means having a straight line frequency characteristic within the frequency range of each band for tuning said oscillator and said preselector to individual frequencies within said bands, said oscillator second tuning means comprising a variable capacitor, said preselector second tuning means also comprising a variable capacitor, a shaft connected to the said two capacitors for controlling the capacitance of the said capacitors, means for coupling the output from said oscillator to said mixer, said means comprising individual plates secured to the said variable capacitors, a conductive sleeve on said shaft tapering toward the two capacitors.

2. A television tuner for reception of U. H. F. channels comprising a preselector, an oscillator and a mixer where the said preselector and oscillator are connected to the said mixer for obtaining a utilizable signal at an intermediate frequency, means for tuning said oscillator and preselector to different bands in the U. H. F. range, said means providing for equal band spread irrespective of the U. H. F. bands being tuned, a variable capacitor having a straight line frequency characteristic within the frequency range of each band for tuning said oscillator to an individual frequency within said band, a second variable capacitor also having a straight line frequency characteristic for tuning said preselector to an individual frequency within said bands, means for coupling the output from said oscillator to said mixer, said means comprising conductive plates individually secured to the said two capacitors, a silver plated shaft being connected to the two capacitors for varying the capacitance of the said capacitors, said shaft being positioned parallel to the said conductive plates for capacitively coupling the said silver plating on said shaft to the said two capacitors through the said conductive plates.

3. A television tuner for reception of U. H. F. channels comprising a preselector, an oscillator and a mixer where the said preselector and oscillator are connected to the said mixer for obtaining a utilizable signal at an intermediate frequency, means for tuning said oscillator and preselector to different bands in the U. H. F. range, said means providing for equal band spread irrespective of the U. H. F. bands being tuned, a variable capacitor having a straight line frequency characteristic within the frequency range of each band for tuning said oscillator to an individual frequency within said bands, a second variable capacitor also having a straight line frequency characteristic for tuning said preselector to an individual frequency within said bands, means for coupling the output from said oscillator to said mixer, said means comprising conductive plates individually secured to the said two capacitors, a silver plated shaft being connected to the two capacitors for varying the capacitance of the said capacitors, said shaft being positioned parallel to the said conductive plates for capacitively coupling the said silver plating on said shaft to the said two capacitors through the said conductive plates, the said silver plating on said shaft being tapered at the ends facing said conductive plates for varying the amount of coupling with variation of the capacitance of the said capacitors at rotation of said shaft.

4. A television tuner for reception of U. H. F. channels comprising a preselector, an oscillator and a mixer where the said preselector and oscillator are connected to the said mixer for obtaining a utilizable signal at an intermediate frequency, means for tuning said oscillator and preselector to different bands in the U. H. F. range, said means providing for equal band spread irrespective of the U. H. F. bands being tuned, a variable capacitor having a straight line frequency characteristic within the frequency range of each band for tuning said oscillator to an individual frequency within said band, a second variable capacitor also having a straight line frequency characteristic for tuning said preselector to an individual frequency within said bands, means for coupling the output from said oscillator to said mixer, said means comprising conductive plates individually secured to the said two capacitors, a silver plated shaft being connected to the two capacitors for varying the capacitance of the said capacitors, said shaft being positioned parallel to the said conductive plates for capacitively coupling the said silver plating on said shaft to the said two capacitors through the said conductive plates, the said silver plating being tapered at its two ends, the said two taperings directly facing the said conductive plates at the position of said shaft corresponding to maximum capacity of the said two capacitors.

5. A television tuner for reception of U. H. F. channels comprising a preselector, an oscillator and a mixer where the said preselector and oscillator are connected to the said mixer for obtaining a utilizable signal at an intermediate frequency, means for tuning said oscillator and preselector to different bands in the U. H. F. range, said means providing for equal band spread irrespective of the U. H. F. bands being tuned, a variable capacitor having a straight line frequency characteristic within the frequency range of each band for tuning said oscillator to an individual frequency within said band, a second variable capacitor also having a straight line frequency characteristic for tuning said preselector to an individual frequency within said bands, means for coupling the output from said oscillator to said mixer, said means comprising conductive plates individually secured to the said two capacitors, a silver plated shaft being connected to the two capacitors for varying the capacitance of the said capacitors, said shaft being positioned parallel to the said conductive plates for capacitively coupling the said silver plating on said shaft to the said two capacitors through the said conductive plates, the said silver plating being tapered at the two ends of the said shaft facing the said two conductive plates at the position corresponding to the lower frequency within each band.

References Cited in the file of this patent

UNITED STATES PATENTS

| | | |
|---|---|---|
| 2,579,789 | Bussard | Dec. 25, 1951 |
| 2,587,667 | Toth | Mar. 4, 1952 |
| 2,627,579 | Wasmandorff | Feb. 3, 1953 |